United States Patent [19]

Asai

[11] Patent Number: 5,223,044
[45] Date of Patent: Jun. 29, 1993

[54] SOLAR CELL HAVING A BY-PASS DIODE

[75] Inventor: Masahito Asai, Nara, Japan

[73] Assignee: Sharp Kabushiki Kaisha, Osaka, Japan

[21] Appl. No.: 787,924

[22] Filed: Nov. 5, 1991

[30] Foreign Application Priority Data

Nov. 9, 1990 [JP] Japan .................................. 2-304611

[51] Int. Cl.⁵ .......................................... H01L 31/06
[52] U.S. Cl. .................................... 136/255; 136/244; 136/256
[58] Field of Search ........................ 136/244, 255, 256

[56] References Cited

U.S. PATENT DOCUMENTS 4,997,491  3/1991  Hokuyo et al. ..................... 136/255
5,009,720  4/1991  Hokuyo et al. ..................... 136/255

Primary Examiner—Aaron Weisstuch
Attorney, Agent, or Firm—Nixon & Vanderhye

[57] ABSTRACT

A solar cell having a by-pass diode includes a second conductivity type layer and a second conductivity type well formed on the front surface of a first conductivity type semiconductor substrate, and a first conductivity type layer formed in a second conductivity type well. A comb-shaped front electrode is formed over the front surface of the substrate and includes a plurality of narrow grid fingers and a bus portion to which the grid fingers are connected. At least a part of the bus portion of the electrode covers the entire first conductivity type layer. A back electrode is formed on the back surface of the substrate. The first conductivity type substrate and the second conductivity type layer constitute the solar cell, and the second conductivity type well and the first conductivity type layer constitute the by-pass diode. The solar cell and the by-pass diode are electrically connected in parallel between the front electrode and the back electrode with their polarities being opposite to each other.

18 Claims, 16 Drawing Sheets

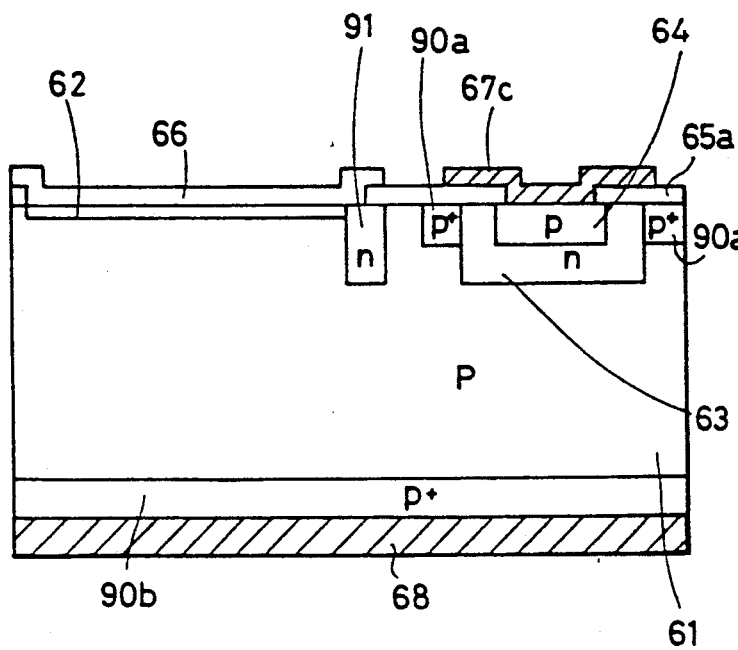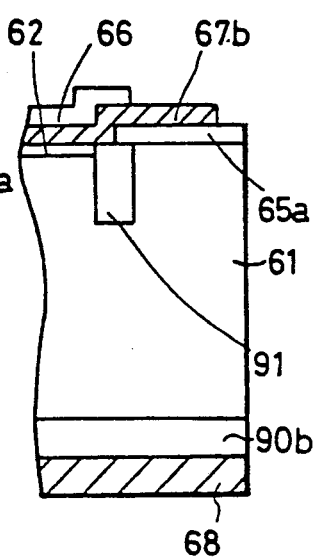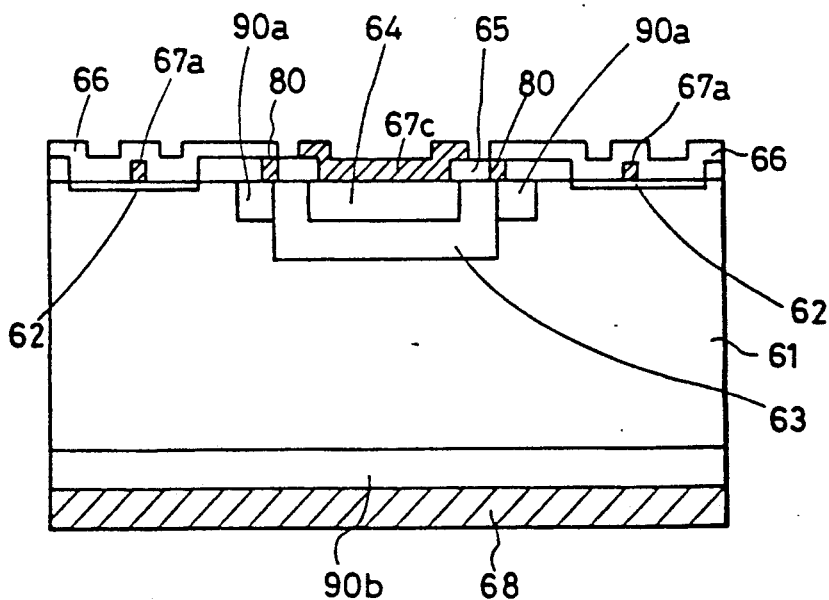

SOLAR CELL HAVING A BY-PASS DIODE

BACKGROUND OF THE INVENTION

The present invention relates generally to solar cells and, more particularly, to improvements in solar cells having by-pass diodes for preventing the solar cells from being damaged when a reverse bias voltage is applied to the solar cells.

Referring to FIG. 1, there is schematically illustrated one example of a typical electric power generating device utilizing sunlight. This electric power generating device includes a solar cell array having a plurality of solar cells arranged in a matrix. The cell array includes a plurality of submodules 30 which are electrically connected in series, and each of the submodules 30 includes a plurality of solar cells 10, 11, 12 and 13 which are electrically connected in parallel. The total output of the cell array is connected to a load L.

In such a cell array, when some solar cells are shaded while all the remaining solar cells are irradiated with light, a reverse bias voltage is applied to the shaded solar cells. When the reverse bias voltage is large, the shaded cells are sometimes damaged, reducing the electric power generating ability of the cell array. A by-pass diode may be provided for passing a current in a direction opposite that of the output current of the submodules 30 in order to prevent the adverse effects caused by the reverse bias.

Referring to FIGS. 2A and 2B, submodules 30 are shown having one or more by-pass diodes. In FIG. 2A, one by-pass diode D is provided for one submodule 30 while by-pass diodes $D_1$, $D_2$, $D_3$, and $D_4$ are provided for solar cells 10, 11, 12, and 13, respectively, in FIG. 2B. Conventionally, these by-pass diodes are formed separately from the solar cells and are connected to the solar cells by wiring.

FIG. 3 illustrates a technique in which a by-pass diode is formed using the same semiconductor substrate on which the solar cell is formed. In the solar cell of FIG. 3, an n-type front diffusion layer 21 is formed on the front surface of a p-type silicon substrate 20 and a front electrode 24 is formed on a part thereof. Light is received through front diffusion layer 21, and electric power is generated by the effect of the pn junction formed at the interface of n-type layer 21 and p-type substrate 20. An n-type back diffusion layer 22 is formed by mesa-etching, and an electrode 23 for the by-pass diode is formed thereon. A back electrode (not shown) to be connected to another adjacent cell is further formed on a part of the back surface of silicon substrate 20.

Referring to FIG. 4, there is shown an equivalent circuit diagram of the solar cell in FIG. 3. As seen from this diagram, the positive potential side of a solar cell SC is connected to the negative potential side of a by-pass diode BD. The negative potential side of solar cell SC and the positive potential side of by-pass diode BD are open.

In the perspective view of FIG. 5A, three solar cells are connected in series. The negative side of a first cell 1 is connected to the positive side of a second cell 2 by a lead 25 and, similarly, the negative side of the second cell 2 is connected to the positive side of a third cell 3 by another lead 25. Leads 27, 28 on both ends are connected to a load (not shown). The positive side of the first cell 1 is connected to a back diffusion layer 22 on the back surface of the second cell by a lead 26, and similarly, the positive side of the second cell 2 is connected to back diffusion layer 22 of the third cell 3 by a lead 26.

Referring to FIG. 5B, there is shown an equivalent circuit diagram of the solar cells connected in series in FIG. 5A. That is, a by-pass diode A including n-type back diffusion layer 22 and a p-type silicon substrate 20 in the second cell 2 serves as a by-pass for the first cell 1 and a by-pass diode B on the third cell serves as a by-pass for the second cell. Accordingly, for the third cell 3, a separate diode C must be connected in parallel with the third cell 3.

Two leads 25, 26 are required between adjacent cells in a cell array including a plurality of solar cells having three terminals. The process for connecting an individual diode C to a solar cell is also complicated, increasing the manufacturing cost. Furthermore, in some cases, the individual diode C, and wires for connecting the same to a cell, project from the level of the main surface of the cell. Such projection of diode C and its connecting wires is not preferable in a cell array which must be folded, such as a solar cell array used in space.

A solar cell is available including an integrated by-pass diode and having only two terminals, as shown in FIG. 6, so as to overcome the difficulties in a cell array including cells having three terminals, as stated above. In the cell of FIG. 6, a p+ layer 41 is formed on the back surface of a p-type silicon substrate 40, which is covered with a back electrode 46. An n layer 42 is formed over a considerable portion of the front surface of silicon substrate 40, which is covered with an anti-reflection film 45. Light is received through n layer 42.

An n-type well 48 is formed in another portion of the front surface of substrate 40 and a p layer 49 is formed in a surface portion thereof. The portion of the front surface of substrate 40 except n layer 42 is covered with a $SiO_2$ film 44. One end of a comb-shaped front electrode 43 connected to n layer 42 and formed on $SiO_2$ film 44 is connected to p layer 49 through a contact hole made in $SiO_2$ film 44. The junction between an n-type well 48 and the p-type silicon substrate 40 is short-circuited by a short-circuit electrode 47 through another contact hole formed in $SiO_2$ film 44.

Referring to FIG. 7, there is shown an equivalent circuit diagram of the solar cell of FIG. 6. The solar cell SC in this figure includes p substrate 40 and n layer 42 in FIG. 6 and has two terminals 67, 68. A by-pass diode BD having a polarity opposite to that of solar cell SC and a parasitic diode DSC having the same polarity as that of cell SC are connected in series and in parallel with solar cell SC between terminals 67, 68. Parasitic diode DSC, however, is short-circuited.

By-pass diode BD includes n well 48 and p layer 49 in FIG. 6. Parasitic diode DSC includes p substrate 40 and n well 48 in FIG. 6 and is short-circuited by short-circuit electrode 47. That is, when a reverse bias voltage is applied to solar cell SC, the pn junction of by-pass diode BD is in the forward direction with respect to the reverse bias voltage and functions to release the reverse bias voltage between terminals 67, 68.

Also in the solar cell of FIG. 6, however, there are problems as follows. First, if the by-pass diode is located in the corner portion of the solar cell and the corner portion is mechanically damaged, the by-pass diode is disabled. Additionally, the heat generated when the current flows through the by-pass diode cannot be efficiently released. In some cases, the surface region (indicated by an arrow (a) in FIG. 6) of p-substrate 40 between n-well 48 for the by-pass diode and n-layer 42 for the solar cell is inverted to the n-type, degrading its electric characteristics.

Moreover, in some cases, n layer 42 for receiving incident light and p substrate 40 are short-circuited by front electrode 43 a the point indicated by an arrow (b) in FIG. 6, thereby degrading the electric characteristics. Though it is possible to carry out an insulation treatment by forming a CVD oxide film or a thermal oxide film in the vicinity of the point indicated by the arrow (b) in order to prevent the short-circuit, such an insulation treatment increases the manufacturing cost. Additionally, if the area of short-circuit electrode 47 is small, it degrades the forward direction characteristics of by-pass diode BD. Accordingly, when the current flows in by-pass diode BD, the heat generated by the current becomes large, resulting in the solar battery cell being damaged by the generated heat as well as increasing the amount of electric power lost.

SUMMARY OF THE INVENTION

An object of the present invention is to improve a solar cell having only two terminals and including a by-pass diode formed on a common semiconductor substrate on which the solar cell is also formed.

In accordance with one aspect of the present invention, a solar cell having a by-pass diode includes a semiconductor substrate of a first conductivity type having a front surface and a back surface, a second conductivity type layer formed in a region of the front surface of the substrate for receiving light for photoelectric conversion, a second conductivity type well formed in a region other than the second conductivity type layer on the front surface of the substrate, a first conductivity type layer formed in the well, a comb-shaped front electrode formed over the front surface of the substrate, the comb-shaped electrode including a plurality of narrow grid fingers and a bus portion to which the grid fingers are connected, the bus portion including an enlarged portion in a region other than its both ends, and a back electrode formed on the back surface of the substrate, the first conductivity type substrate and the second conductivity type layer constituting the solar cell, the second conductivity type well and the first conductivity type layer constituting the by-pass diode, the by-pass diode being formed under the enlarged portion of the comb-shaped electrode, and the solar cell and the by-pass diode being electrically connected in parallel between the front electrode and the back electrode, with their polarities being opposite to each other.

In accordance with another aspect of the present invention, a solar cell having a by-pass diode includes a semiconductor substrate of a first conductivity type having a front surface and a back surface, a second conductivity type layer formed in a region of the front surface of the substrate for receiving light for photoelectric conversion, a second conductivity type well formed in a region other than the second conductivity type layer on the front surface of the substrate, a first conductivity type layer formed in the well, a comb-shaped front electrode formed over the front surface of the substrate, the comb-shaped electrode including a plurality of narrow grid fingers and a wide bus portion to which the grid fingers are connected, a back electrode formed on the back surface of the substrate, and a plurality of short-circuit electrodes for short-circuiting a parasitic diode including the first conductivity type substrate and the second conductivity type well, the first conductivity type substrate and the second conductivity type layer constituting the solar cell, the second conductivity type well and the first conductivity type layer constituting the by-pass diode, the by-pass diode being formed under the bus portion of the comb-shaped electrode, the solar cell and the by-pass diode being electrically connected in parallel between the front electrode and the back electrode with their polarities being opposite to each other, and the short-circuit electrodes being provided along the boundary of the first conductivity type substrate and the second conductivity type well at least between the grid fingers of the comb-shaped electrode.

In accordance with a further aspect of the present invention, a solar cell having a by-pass diode includes a semiconductor substrate of a first conductivity type having a front surface and a back surface, a second conductivity type layer formed in a region of the front surface of the substrate for receiving light for photoelectric conversion, a second conductivity type well formed in a region other than the second conductivity type layer on the front surface of the substrate, a first conductivity type layer formed in the well, a comb-shaped front electrode formed over the front surface of the substrate, the comb-shaped electrode including a plurality of narrow grid fingers and a bus portion to which the teeth are connected, the bus portion including at least one enlarged portion in a region other than its both ends, a back electrode formed on the back surface of the substrate, and a plurality of short-circuit electrodes for short-circuiting a parasitic diode including the first conductivity type substrate and the second conductivity type well, the first conductivity type substrate and the second conductivity type layer constituting the solar cell, the second conductivity type well and the first conductivity type layer constituting the by-pass diode, the by-pass diode being formed under the bus portion of the comb-shaped electrode, the solar cell and the by-pass diode being electrically connected in parallel between the front electrode and the back electrode with their polarities being opposite to each other, and the short-circuit electrodes being provided along the boundary of the first conductivity type substrate and the second conductivity type well at least between the grid fingers of the comb-shaped electrode.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 8B, 8C, and 8D are cross-sectional views taken along lines 8B—8B, 8C—8C, and 8D—8D in FIG. 8A, respectively;

DESCRIPTION OF THE PREFERRED EMBODIMENTS

Figure 8A:
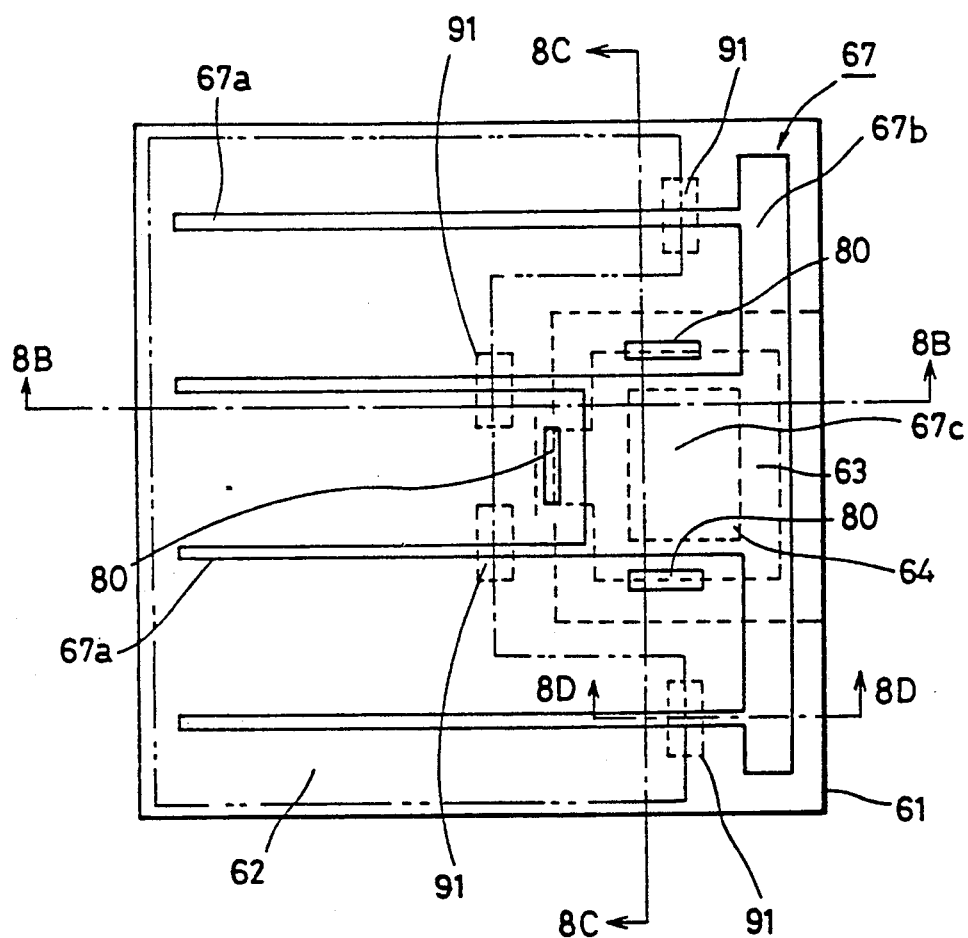
FIG. 8A is a plan view schematically showing a solar cell according to a first embodiment of the present invention.

Referring to FIGS. 8A to 8D, there is schematically illustrated a solar cell including a by-pass diode according to a first embodiment of the present invention. FIG. 8A shows the front surface of the solar cell, and FIGS. 8B, 8C, and 8D show cross-sections taken along lines 8B—8B, 8C—8C, and 8D—8D in FIG. 8A, respectively.

In these figures, an $n^+$-type diffusion layer 62 is formed in a region for receiving light on the front surface of a p-type silicon substrate 61. P-type substrate 61 and $n^+$ layer 62 constitute the solar cell. An n-type well 63 is formed in a part of the remaining region on the front surface of substrate 61 and a p-type diffusion layer 64 is formed in n-type well 63. N-type well 63 and p-type layer 64 constitute a by-pass diode.

N-type well 63 is surrounded by a $p^+$-layer 90a, which serves as a channel stopper between $n^+$-layer 62 and and n-well 63. $p^+$-layer 90a can be formed at the same time that p-layer 64 is formed. The front surface of silicon substrate 61 is protected by an oxide film 65a, except at the region where $n^+$-layer 62 is formed.

$N^+$-layer 62 is connected to p-layer 64 through a contact hole in oxide film 65a by a comb-shaped front electrode 67 and is covered with a transparent anti-reflection film 66. A plurality of grid fingers 67a of comb-shaped electrode 67 are connected to a bus portion 67b. Bus portion 67b has an enlarged central portion 67c. Enlarged portion 67c is an area to which an interconnector (not shown) is to be connected. An n-type layer 91 formed along the boundary of $n^+$-layer 62 under each grid finger 67a of comb electrode 67 serves to prevent $n^+$-layer 62 and p-type substrate 61 from being short-circuited by comb-shaped electrode 67. N-layers 91 can be formed at the same time that n-well 63 is formed.

A $p^+$-layer 90b is formed on the back surface of silicon substrate 61, improving the longer-wave sensitivity of the solar cell due to BSF (Back Surface Field) effects. $p^+$-layer 90b is covered with a back electrode 68.

A parasitic diode including p-substrate 61 and n-well 63 is short-circuited by a plurality of short-circuit electrodes 80 in a plurality of contact holes formed along the boundary of n-well 63 in oxide film 65a. Accordingly, the by-pass diode including n-well 63 and p-layer 64 is connected in parallel with the solar cell including p-substrate 61 and $n^+$-layer 62 between front electrode 67 and back electrode 68, and is shaded from the light by enlarged portion 67c of comb-shaped electrode 67. That is, the equivalent circuit of the solar cell shown in FIGS. 8A to 8D is the same as that shown in FIG. 7.

Figure 7:
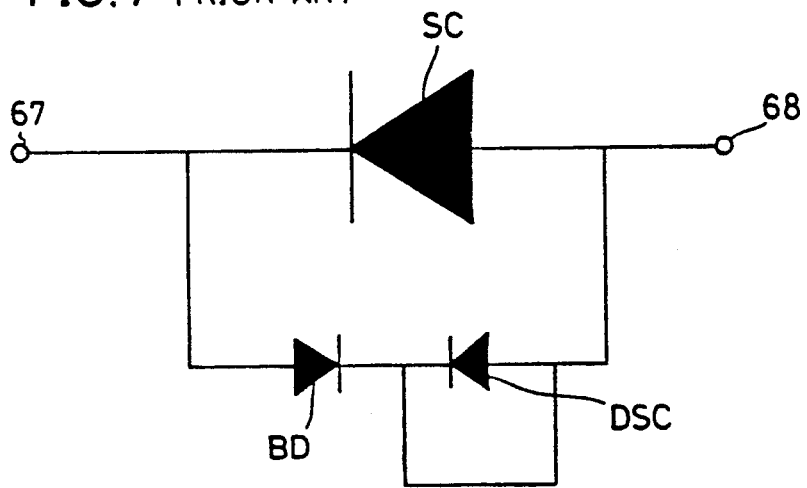
FIG. 7 is an equivalent circuit diagram of the solar cell of FIG. 6.

Referring to FIGS. 8A to 8D along with FIG. 7, in the normal operation of the solar cell SC including the pn junction of p substrate 61 and $n^+$ layer 62, photo-electromotive force is generated, which brings back electrode 68 to a positive potential and front electrode 67 to a negative potential. Accordingly, a negative potential is applied to p layer 64 and a positive potential is applied to n well 63 in by-pass diode BD by the photo-electromotive force. That is, by-pass diode BD is connected in the reverse direction with respect to the photoelectromotive force of solar cell SC and thus it does not cause a loss of the photoelectromotive force. Additionally, if by-pass diode BD is shaded from the light by enlarged portion 67c of front electrode 67, it does not generate photoelectromotive force, causing no adverse effect on the electromotive force of solar cell SC.

Figure 1:
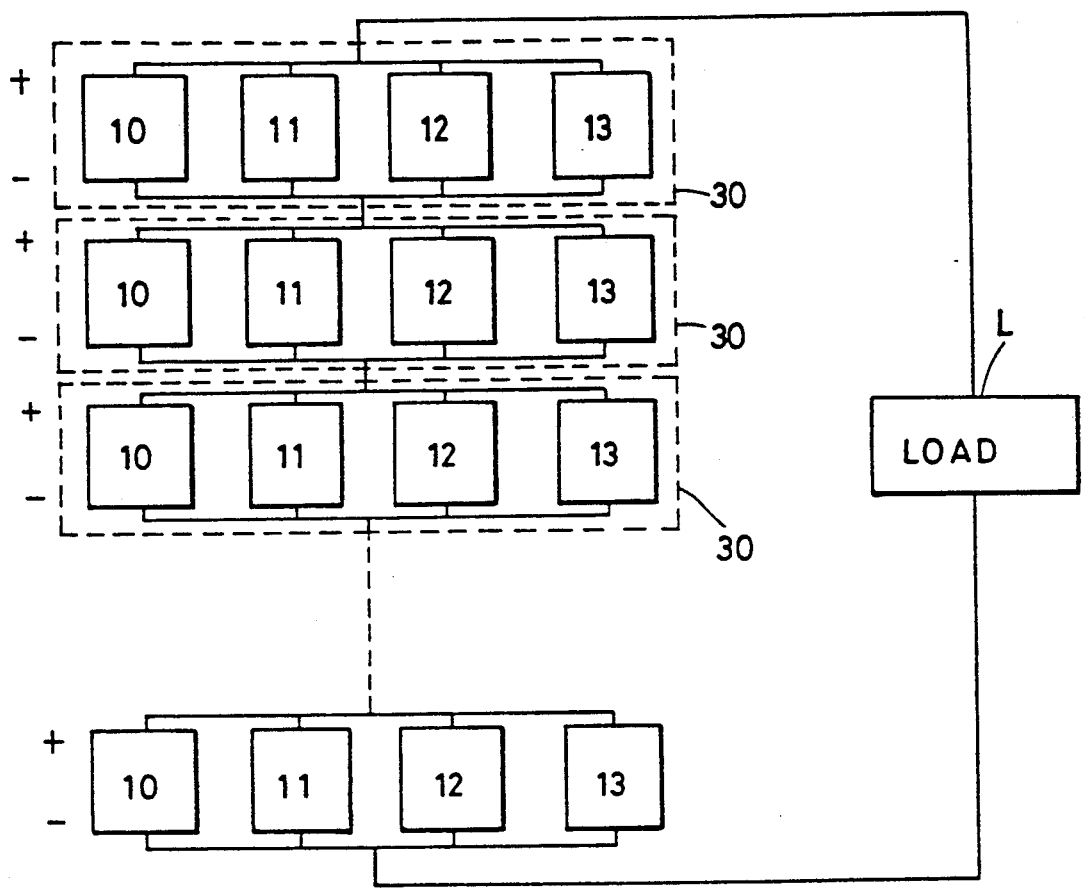
FIG. 1 is a block diagram illustrating a solar cell array.
Figure 2A:
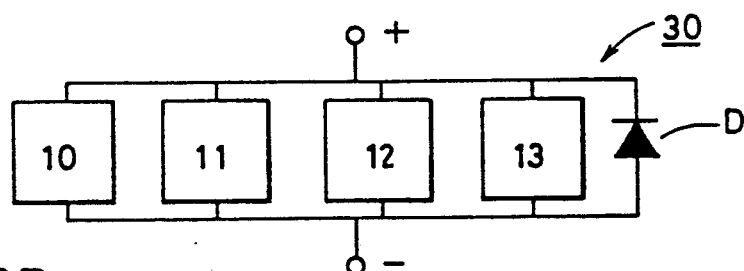
FIG. 2A is a diagram showing a submodule including a plurality of solar cells connected in parallel and one by-pass diode.
Figure 2B:
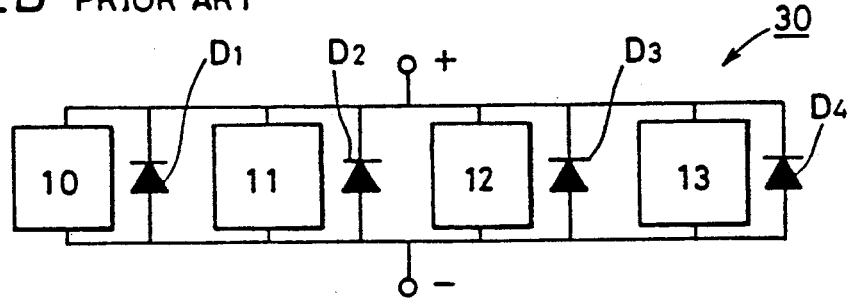
FIG. 2B is a diagram showing a submodule including a plurality of solar cells connected in parallel and plurality of by-pass diodes.
Figure 3:
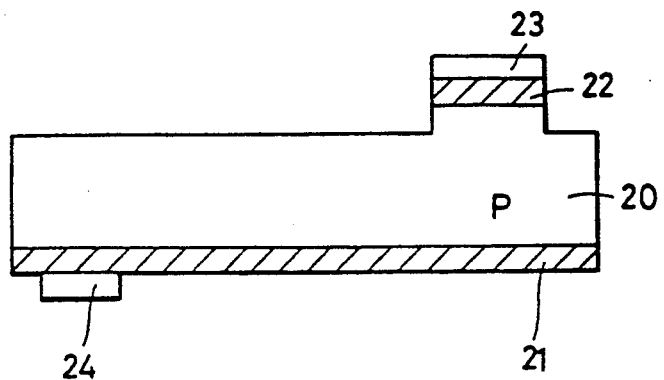
FIG. 3 is a cross-sectional view of a solar cell having a by-pass diode.
Figure 4:
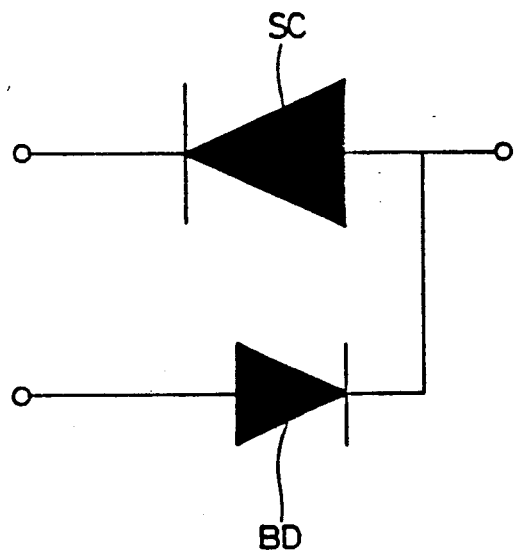
FIG. 4 is an equivalent circuit diagram of the solar cell of FIG. 3.
Figures 5A, 5B:
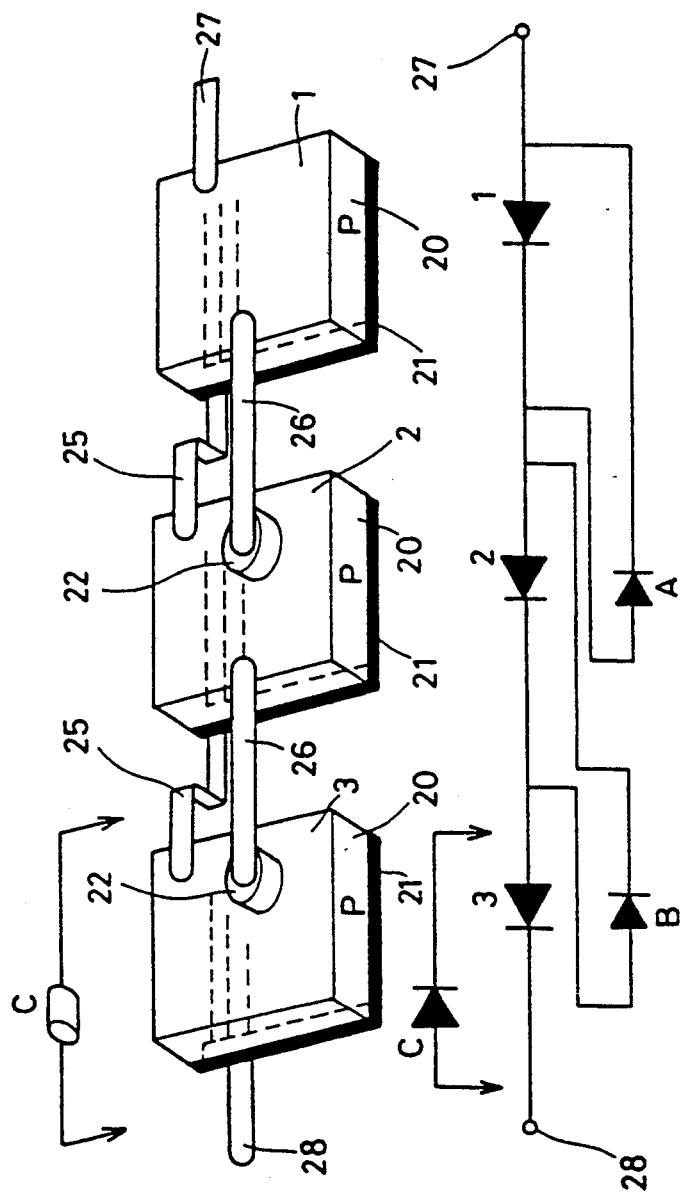
FIG. 5A is a perspective view illustrating an arrangement where a plurality of solar cells of FIG. 3 are connected in series.
FIG. 5B is an equivalent circuit diagram of the solar cells connected in series in FIG. 5A.
Figure 6:
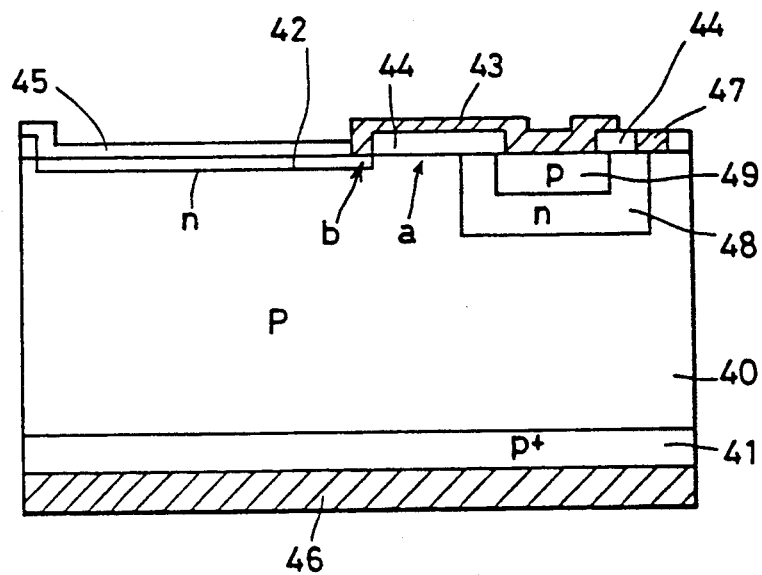
FIG. 6 is a cross-sectional view showing another solar cell.

In a solar cell as shown in FIG. 1 assembled using a plurality of solar cells of FIG. 8A, if some solar cells stop generating electric power for some reason (for example, shade), a reverse bias voltage is applied to those solar cells. At that time, because a bias voltage in the forward direction is applied to the by-pass diodes corresponding to the shaded cells, no reverse bias voltage larger than the relatively small forward direction voltage of the by-pass diode is applied to the solar cell. As a result, the solar cell is protected from the relatively high reverse bias voltages.

A method of manufacturing the solar cell of FIG. 8B will now be described in the following in conjunction with FIGS. 9A to 9K.

Figure 9A:
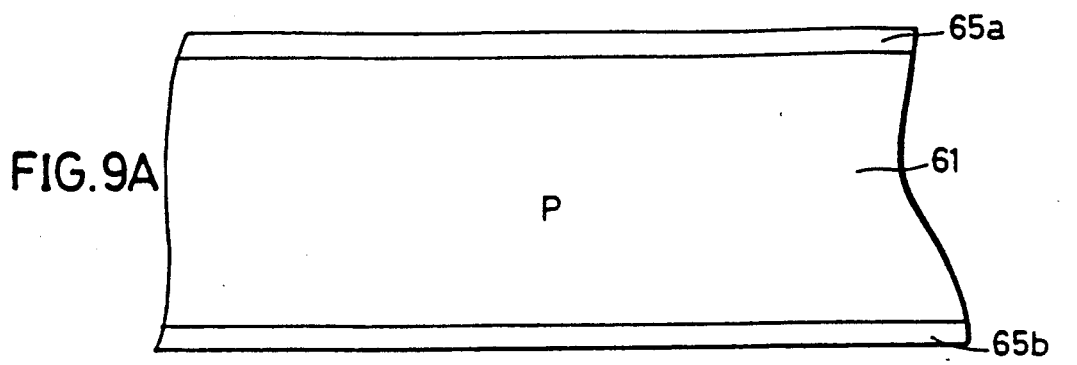
FIGS. 9A to 9K are cross-sectional views illustrating a manufacturing process of the solar cell in FIG. 8B.

Firstly, in FIG. 9A, oxide films 65a and 65b are formed on the main surfaces of the upper and lower sides of a p-type silicon wafer substrate 61, respectively.

Figure 9B:
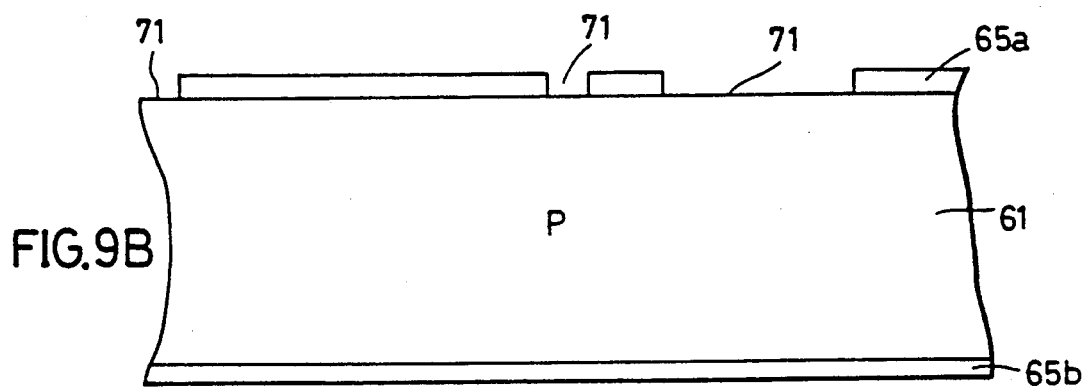

In FIG. 9B, a plurality of openings 71 are made in oxide film 65a on the upper side by photoetching.

Figure 9C:
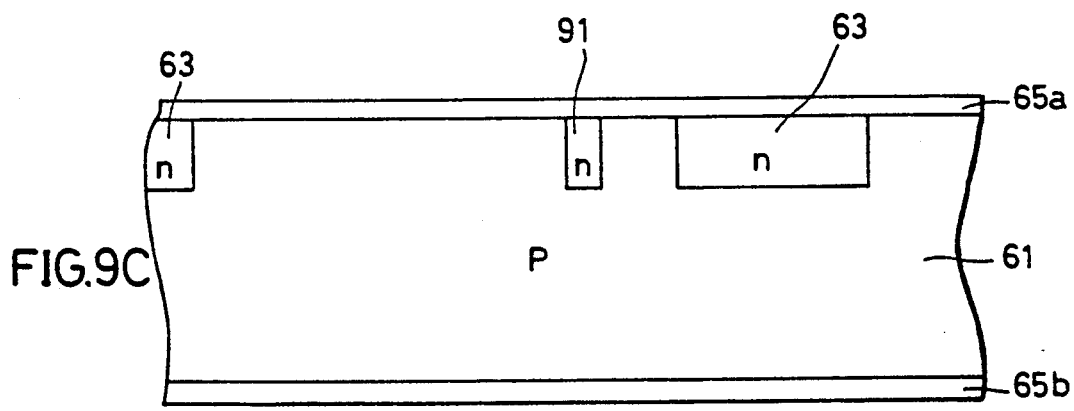

Referring to FIGS. 9B and 9C, n-type well 63 and an n-type diffusion layer 91 for preventing a short-circuit are formed through openings 71 and then openings 71 are again covered with oxide film 65a.

Figure 9D:
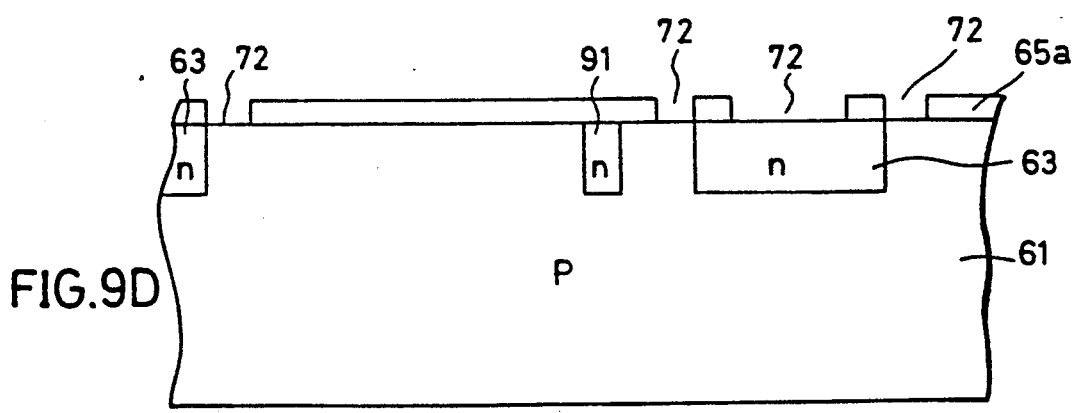

In FIG. 9D, a plurality of openings 72 are made in oxide film 65a on the upper side by photoetching and oxide film 65b on the lower side is removed.

Figure 9E:
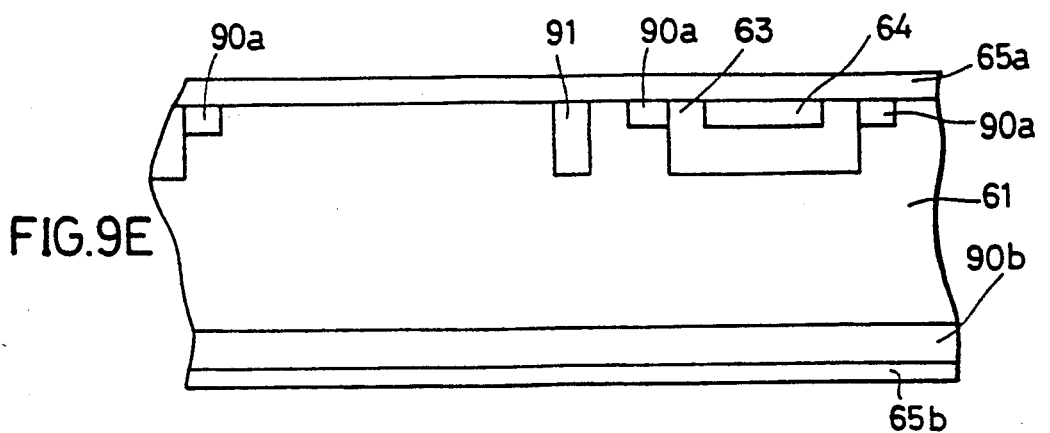

Referring to FIGS. 9D and 9E, through openings 72 in oxide film 65a on the upper side, a p-diffusion layer 64 is formed in n-well 63 and a p+-diffusion layer 90a is formed, surrounding n well 63 and serving as a channel stopper. N-well 63 and p-diffusion layer 64 constitute a by-pass diode. At the same time, a p+-diffusion layer 90b is formed on the main surface of the lower side of substrate 61, thereby providing a BSF structure. Thereafter, openings 72 and p+-diffusion layer 90b are covered with oxide films 65a and 65b on the upper and lower sides, respectively.

Figure 9F:
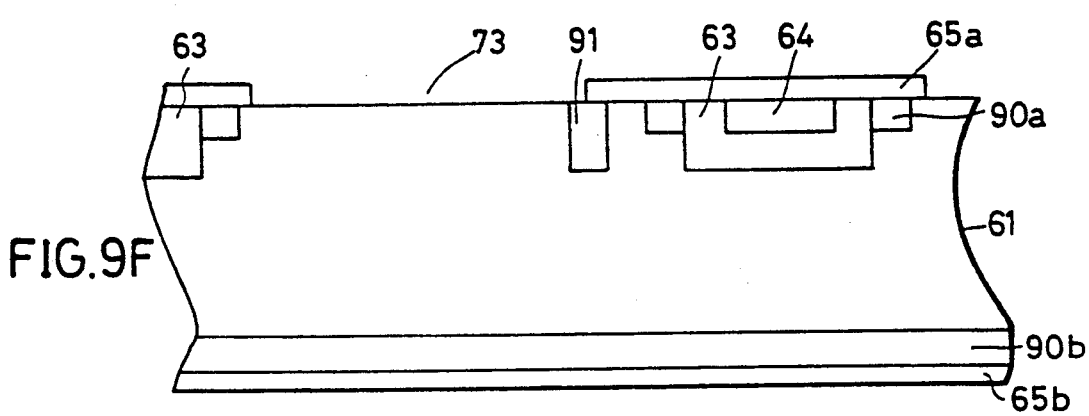

In FIG. 9F, an opening 73 is made in oxide film 65a of the upper side by photoetching.

Figure 9G:
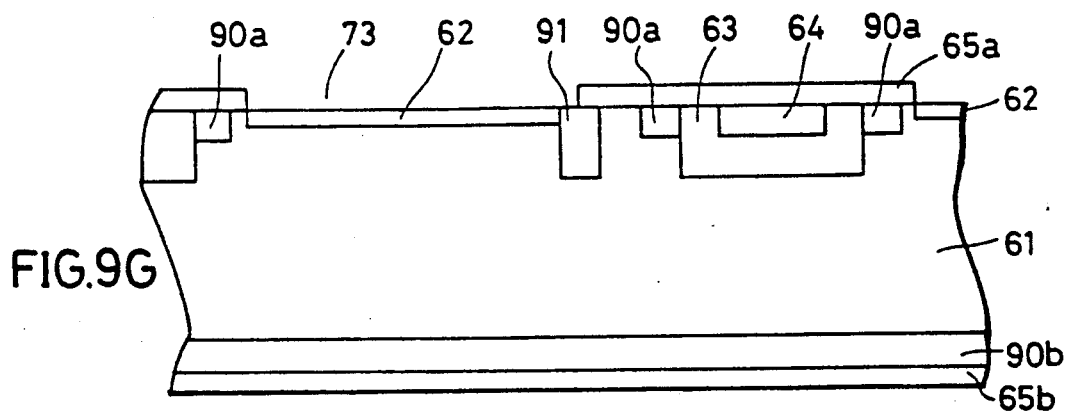

In FIG. 9G, an n+-diffusion layer 62 is formed through opening 73; p-substrate 61 and n+-layer 62 constitute a solar cell.

Figure 9H:
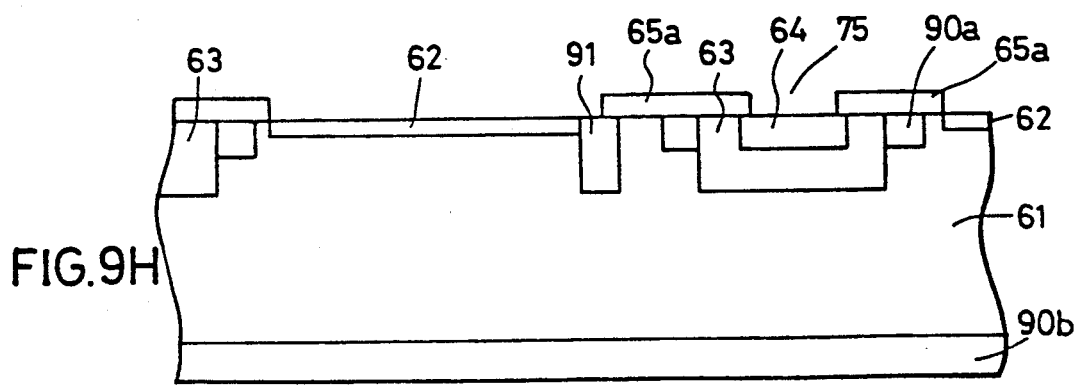

In FIG. 9H, a contact hole 75 is made in upper side oxide film 65a on n-layer 64 by photoetching and lower side oxide film 65b is removed.

Figure 9I:
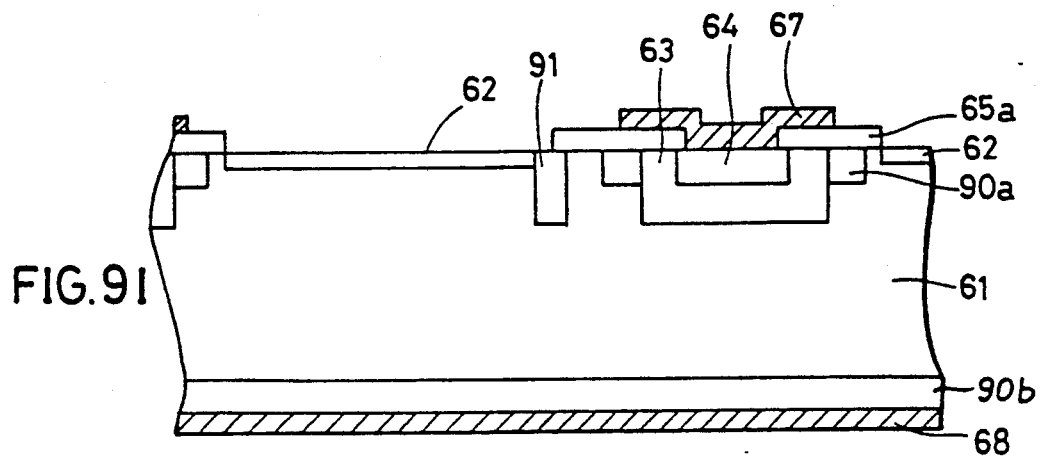

In FIG. 9I, a comb-shaped electrode 67 is formed for electrically connecting n+-diffusion layer 62 to p-layer 64 through contact hole 75. An enlarged portion 67c of comb-shaped electrode 67 shields the by-pass diode including n-well 63 and p-layer 64 from the light. Short-circuit electrodes 80 shown in FIG. 8C (but not shown in FIG. 9I) are also formed at the same time. Furthermore, n+-layer 90b on the lower surface of substrate 61 is covered with a back electrode 68. These electrodes 67, 68, and 80 can be formed by vacuum evaporation, for example.

Figure 9J:
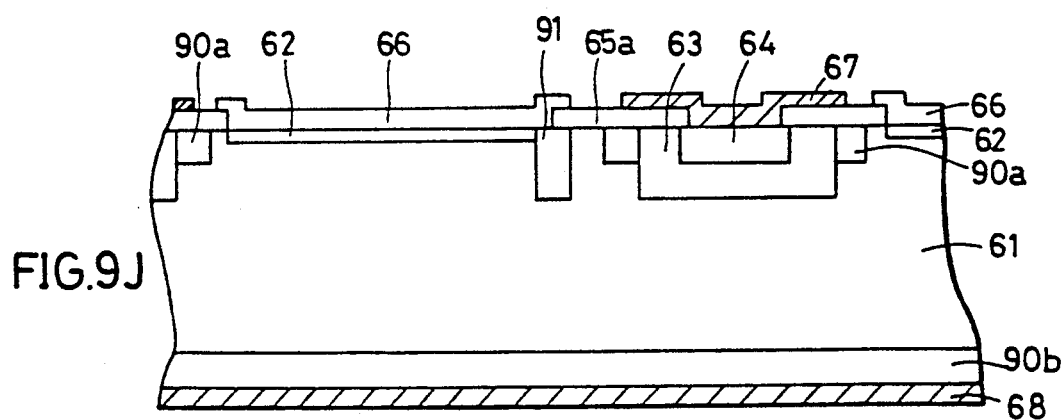

In FIG. 9J, enlarged portion 67c of comb-shaped electrode 67, i.e. an area to which at least an interconnector is to be connected, is covered with a mask (not shown) and transparent anti-reflection film 66 is formed on n+ layer 62.

Figure 9K:
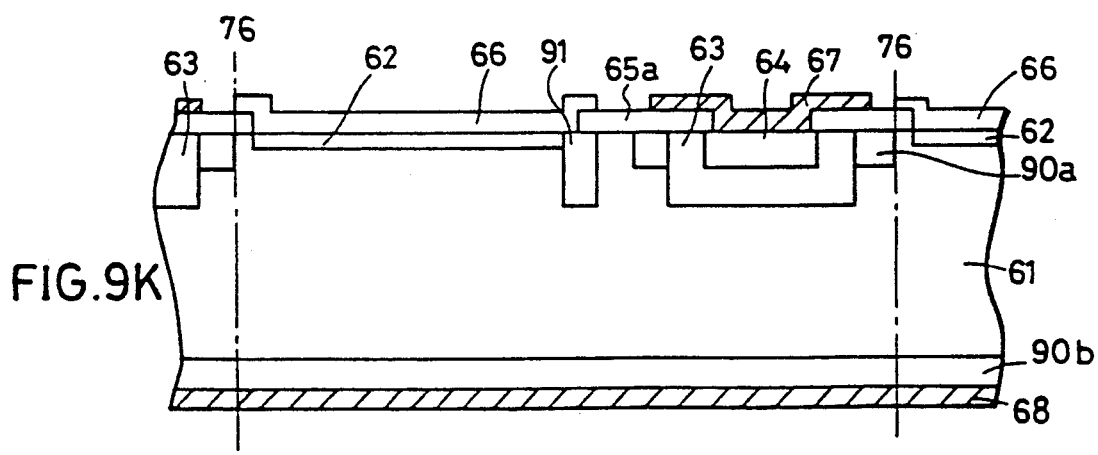

In FIG. 9K, silicon wafer 61 is cut by dicing along lines 76 in the longitudinal direction indicated by the dot-and-dash lines thereby to obtain the solar cell of FIG. 8B.

Figure 10A:
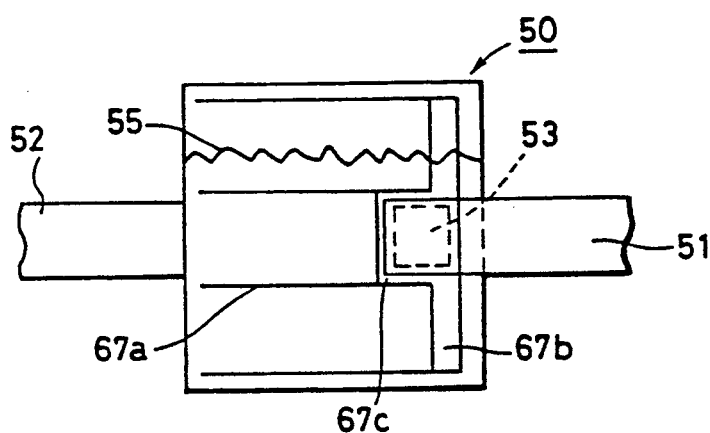
FIGS. 10A and 10B are a plan view and a side view, respectively, schematically showing the connection of an interconnector to the solar cell of FIG. 8A.
Figure 10B:
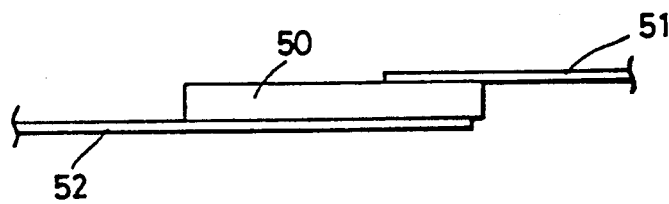

Referring to FIGS. 10A and 10B, connection of the interconnector to the solar cell in FIG. 8A is schematically illustrated. One end of a first interconnector 51 is connected to enlarged portion 67c of comb-shaped electrode 67 on the front surface of a solar cell 50. A by-pass diode 53 is formed under enlarged portion 67c of comb-shaped electrode 67. The other end of the first interconnector 51 is connected to the back electrode of an adjacent solar cell (not shown). A second interconnector 52 connected to the back electrode of solar cell 50 is connected to an enlarged portion of a comb-shaped electrode on another adjacent solar cell (not shown).

In a conventional solar cell, a by-pass diode is not formed under an interconnector and the interconnector is connected to the input/output portion of the solar cell. Accordingly, if a crack 55 as shown FIG. 10A is caused, there is a possibility that the function of the by-pass diode becomes disabled in the conventional solar cell. In the combination of the solar cell and the interconnector as shown in FIG. 10A, however, the function of by-pass diode 53 is not hindered even by crack 55. That is, it is possible to minimize a decrease in the output of the solar cell group connected in series to the solar cell in which crack 55 occurs.

Figure 11A:
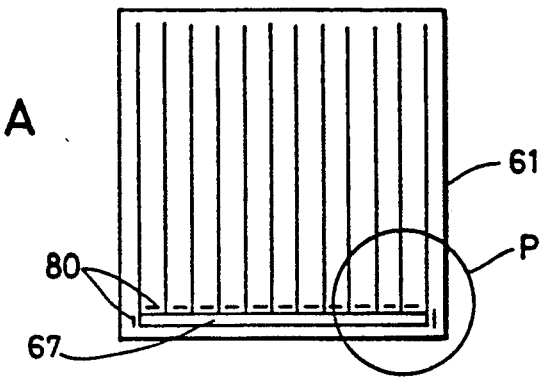
FIG. 11A is a plan view schematically showing a solar cell according to a second embodiment of the present invention.
Figure 11B:
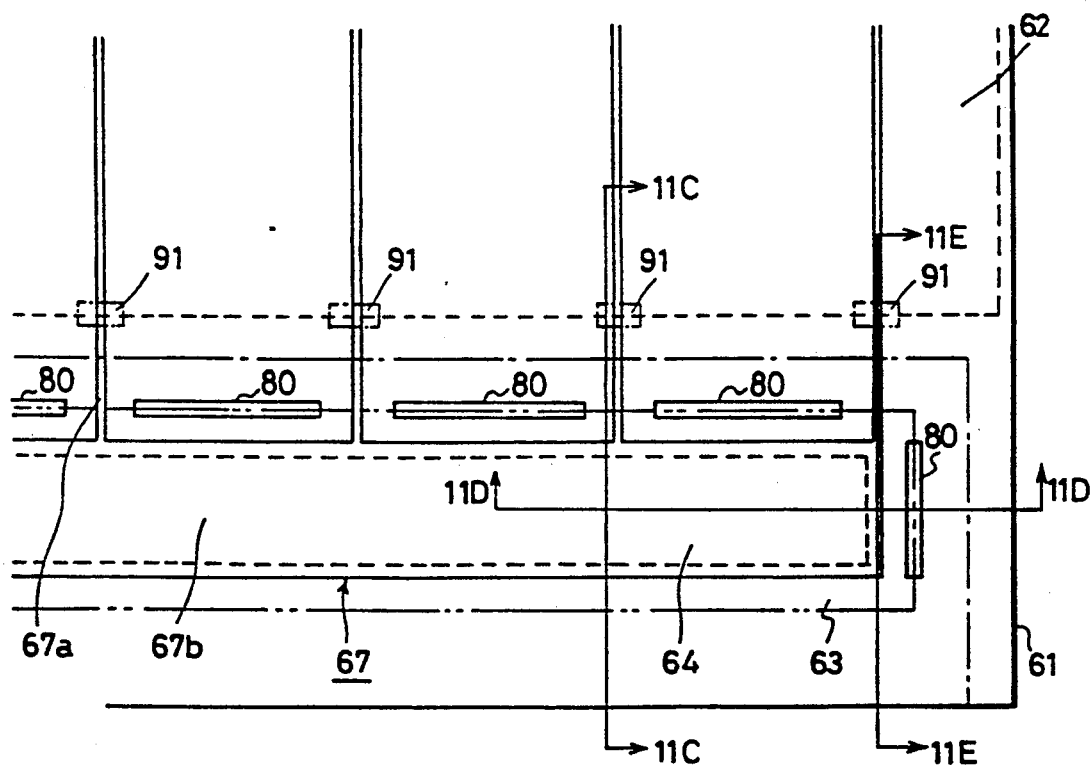
FIG. 11B is an enlarged view showing the detail of the region surrounded by the circle in FIG. 11A.
Figure 11C:
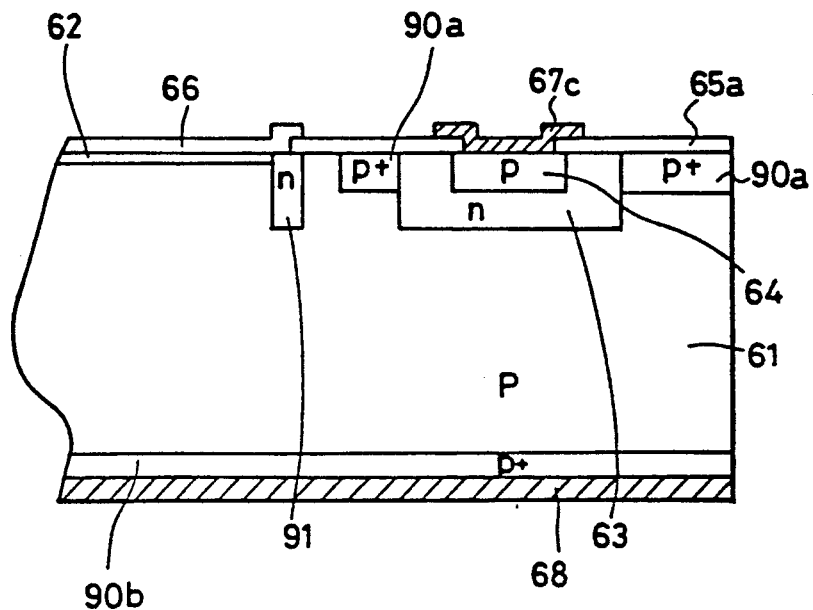
FIGS. 11C, 11D, and 11E are cross-sectional views taken along lines 11C—11C, 11D—11D, and 11E—11E in FIG. 11B, respectively.
Figure 11D:
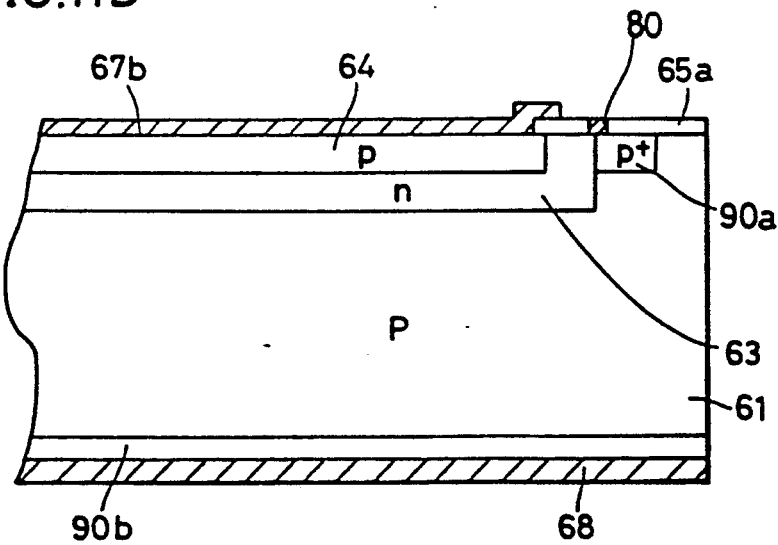
Figure 11E:
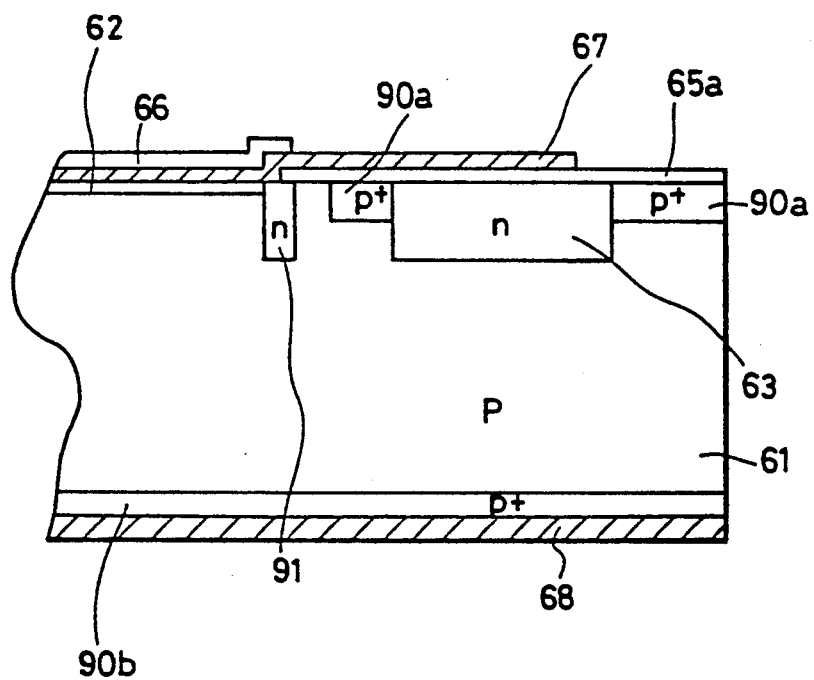

Referring to FIGS. 11A to 11E, there is schematically illustrated a solar cell including a by-pass diode according to a second embodiment of the present invention. FIG. 11A shows the front surface of the solar cell and FIG. 11B shows the region surrounded by the circle in FIG. 11A, after magnification. FIGS. 11C, 11D, and 11E show cross sections taken along lines 11C—11C, 11D—11D, and 11E—11E in FIG. 11B, respectively.

Though the solar cell according to the second embodiment is similar to that in the first embodiment, the configuration of n-well 63 and p layer 64 constituting the by-pass diode has been modified and, accordingly, the configuration of comb-shaped electrode 67 has also been modified. That is, n-well 63 is formed into an elongated rectangle along one side of a square silicon substrate and, similarly, p-layer 64 is also formed into an elongated rectangle. Grid fingers 67a of comb-shaped electrode 67 are connected to a bus portion 67b. Bus portion 67b covers the rectangular p layer 64. Furthermore, a plurality of short-circuit electrodes 80 are arranged along the boundary of n well 63 between grid fingers 67a of comb-shaped electrode 67 and are also provided on the boundary on both ends in the longitudinal direction of n well 63. The solar cell according to the second embodiment can be manufactured by the same process as that illustrated in FIGS. 9A to 9K.

Figure 14:
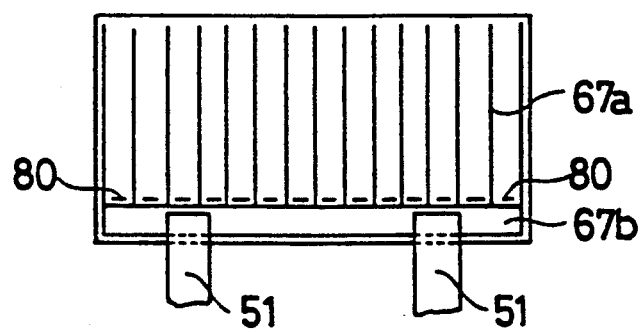
FIG. 14 is a plan view showing an example of connection of an interconnector to the solar cell of the second embodiment.

In the second embodiment, all portions of bus 67b of comb-shaped electrode 67 can be utilized as areas to which at least one interconnector is connected, as exemplarily shown in FIG. 14.

Figure 12:
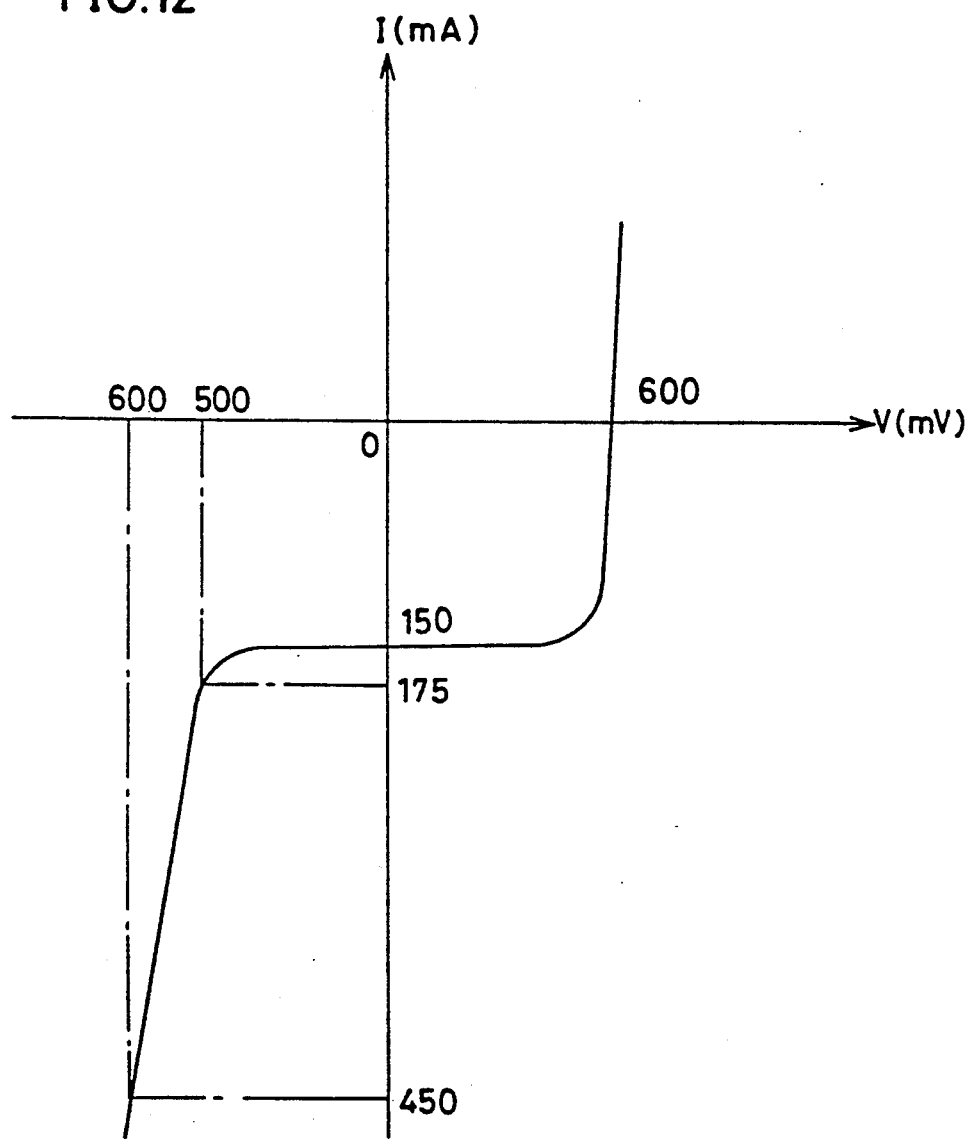
FIG. 12 is a graph showing the voltage-current characteristic of the solar cell in FIG. 11A.

Referring to FIG. 12, there is shown the voltage-current (V-I) characteristic of the solar cell in accordance with the second embodiment. In this graph, the abscissa represents voltage (mV) and the ordinate represents current I (mA). In the second embodiment, as the total length of the short-circuit electrodes 80 along the boundary of n-well 63 is considerably longer than that in the case of the first embodiment, the short-circuit resistance of the parasitic diode including p-substrate 61 and n-well 63 becomes much smaller. Accordingly, it can be seen from the graph of FIG. 12 that when a reverse bias voltage is applied to the solar cell, a reverse bias current easily flows in the by-pass diode (see the lower left part in this graph).

Figure 13A:
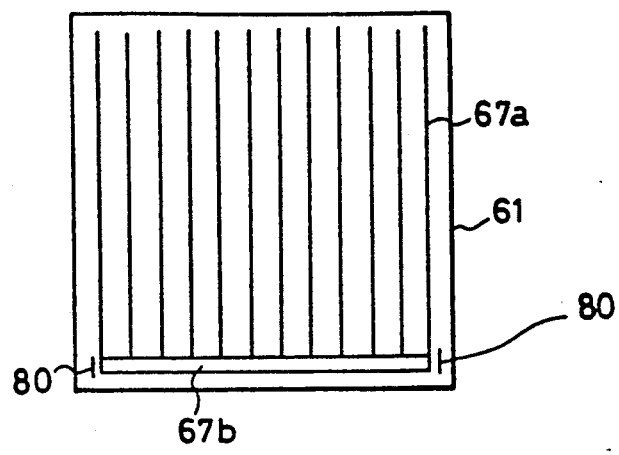
FIG. 13A is a plan view showing a solar cell for comparison.
Figure 13B:
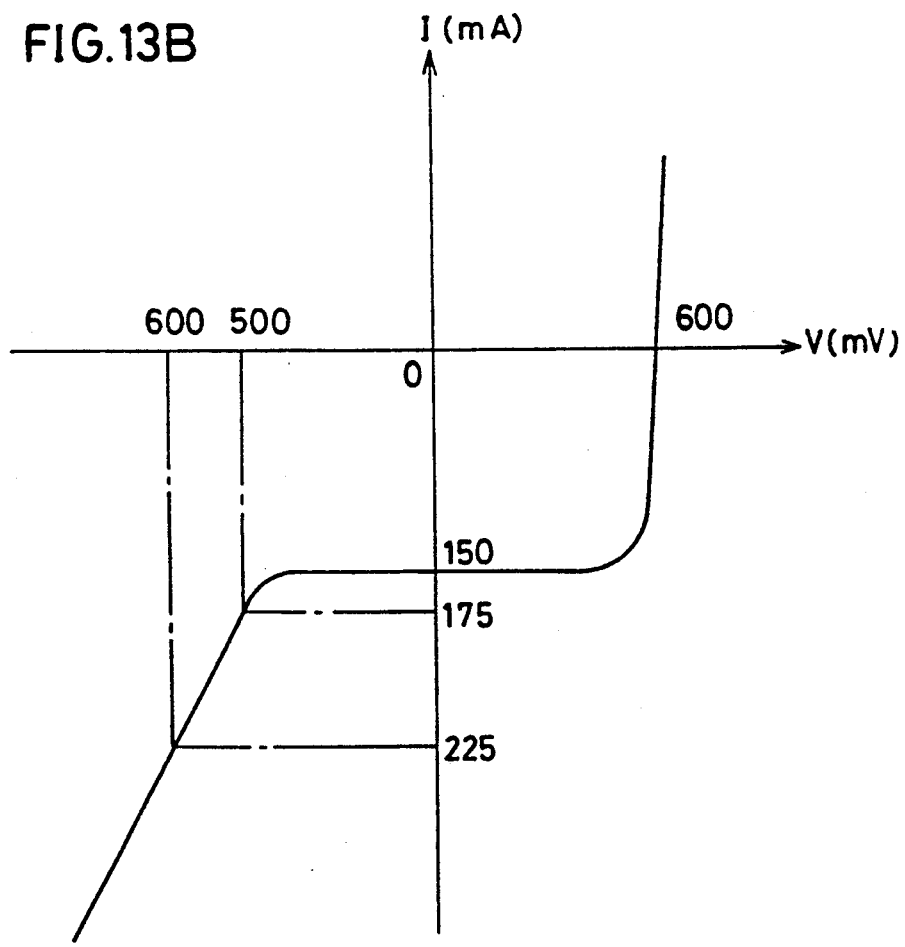
FIG. 13B is a graph showing the voltage-current characteristic of the solar cell in FIG. 13A.

Referring to FIG. 13A, there is shown a diagram of the front surface of a solar cell for comparison with the solar cell in accordance with the second embodiment. Though the solar cell for comparison is similar to that in the second embodiment, short-circuit electrodes 80 are provided only at both ends in the longitudinal direction of an n-well 63. That is, the total length of short-circuit electrodes 80 in the solar cell for comparison is by far shorter than that in the second embodiment. Accordingly, in the solar cell for comparison, the short-circuit resistance of the parasitic diode is larger than that in the second embodiment. FIG. 13B similar to FIG. 12 shows the V-I characteristic of the solar cell for comparison in FIG. 13A. When FIG. 12 is compared with FIG. 13B, it can be clearly seen that when short-circuit electrodes 80 have a large total length, the parasitic diode is short-circuited with a low resistance, so that the by-pass diode can easily pass the reverse bias current in the solar cell of the second embodiment.

In the by-pass diode according to the present invention stated above, as the by-pass diode is formed under the bus portion of the comb-shaped electrode, it does not reduce the area of the light receiving surface of the solar cell.

As the interconnector is connected in the vicinity of the by-pass diode, this interconnector can improve the dissipation efficiency of the heat generated by the current flowing in the by-pass diode.

Furthermore, the interconnector serves to more surely-shield the by-pass diode from the light and prevent the degradation of the diode due to radiation such as α rays.

Figure 15A:
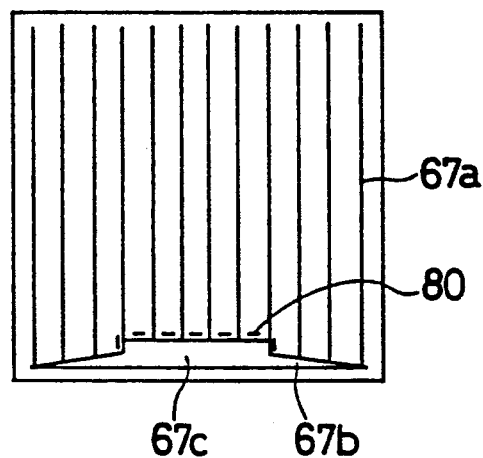
FIG. 15A is a plan view schematically showing a solar cell according to a third embodiment of the present invention.

Referring to FIG. 15A, there is schematically illustrated a solar cell according to a third embodiment of the present invention. The solar cell of the third embodiment is similar to that of the second embodiment, but the bus portion 67b of the comb-shaped electrode 67 in the third embodiment is modified in its shape and includes an enlarged portion 67c in a region intermediate its both ends.

Figure 15B:
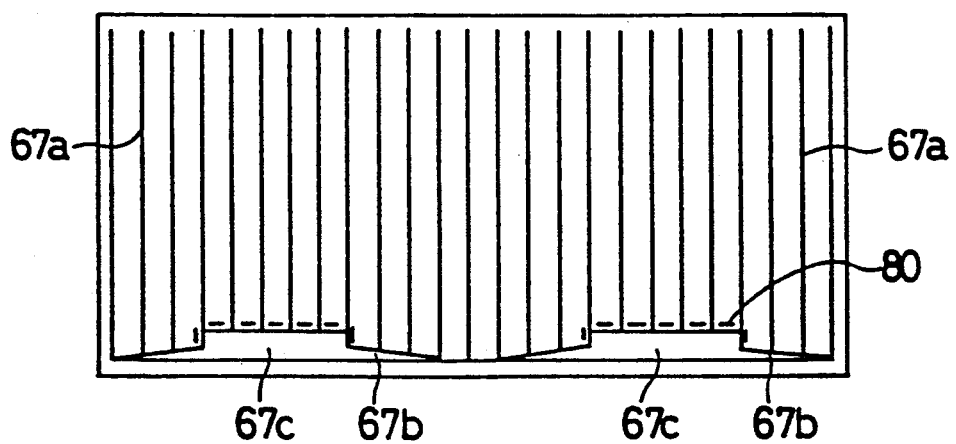
FIG. 15B is a plan view of a solar cell which is a modification of the third embodiment.

FIG. 15B shows a modification of the solar cell of FIG. 15A. The solar cell of FIG. 15B includes a plurality of enlarged portions 67C in regions other than both ends of bus portion 67b of comb-shaped electrode 67.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar cell having a by-pass diode, comprising:
   a semiconductor silicon substrate of a first conductivity type having a front surface and a back surface;
   a first layer having a second conductivity type diffused in a portion of the front surface of said substrate for receiving light for photoelectric conversion;
   a well having a second conductivity type diffused in a second portion of the front surface of said substrate;
   a second layer having a first conductivity type formed in said well;
   a comb-shaped front electrode formed over part of the front surface of said semiconductor substrate, said comb-shaped electrode including a plurality of narrow grid fingers connected to a bus portion, said bus portion including an enlarged portion in a region extending from and intermediate both ends of said bus portion and wider than said bus portion;
   plural short circuit electrodes corresponding to and surrounding extended surfaces of said enlarged portion for short circuiting a parasitic diode formed by said substrate and said well; and
   a back electrode formed on the back surface of said semiconductor substrate;
   wherein said silicon substrate and said first layer constitute said solar cell, and said well and said second layer constitute said by-pass diode,
   said by-pass diode is formed under said enlarged portion of said comb-shaped electrode, and
   said solar cell and said by-pass diode are electrically connected in parallel between said front electrode and said back electrode with their polarities being opposite to each other.

2. The solar cell according to claim 1, wherein a first conductivity type channel stopper having a high impurity concentration is formed along the periphery of said second conductivity type well.

3. The solar cell according to claim 1, wherein a BSF layer of the first conductivity type having a high impurity concentration is formed between said back electrode and said first conductivity type substrate.

4. The solar cell according to claim 1, wherein said enlarged bus portion of said comb-shaped electrode is opague.

5. The solar cell according to claim 1, wherein the enlarged portion of said comb-shaped electrode also serves as an area for joining of an interconnector.

6. A solar cell having a by-pass diode, comprising:
   a semiconductor substrate of a first conductivity type having a front surface and a back surface;
   a second conductivity type layer formed in a first portion of the front surface of said substrate for receiving light for photoelectric conversion;
   a second conductivity type well formed in a second portion of the front surface of said substrate;
   a first conductivity type layer formed in said well;
   a comb-shaped front electrode formed over the front surface of said semiconductor substrate, said comb-shaped electrode including a plurality of narrow grid fingers extending from a bus portion, said bus portion being wider than said grid fingers;
   a back electrode formed on the back surface of said semiconductor substrate; and
   a plurality of short-circuit electrodes provided along the edge of said bus portion and at least between said grid fingers of said comb-shaped electrode for short-circuiting a parasitic diode including said first conductivity type substrate and said second conductivity type well,
   wherein said first conductivity type substrate and said second conductivity type layer constitute said solar cell, said second conductivity type well and said first conductivity type layer constitute said by-pass diode,
   said by-pass diode is formed under and occupies substantially the same area as the bus portion of said comb-shaped electrode,
   said solar cell and said by-pass diode are electrically connected in parallel between said front electrode and said back electrode with their polarities being opposite to each other.

7. The solar cell according to claim 6, wherein a first conductivity type channel stopper having a high impurity concentration is formed along the periphery of said second conductivity type well.

8. The solar cell according to claim 6, wherein a BSF layer of the first conductivity type having a high impurity concentration is formed between said back electrode and said first conductivity type substrate.

9. The solar cell according to claim 6, wherein said bus portion of said comb-shaped electrode is opaque.

10. The solar cell according to claim 6, wherein said bus portion of said comb-shaped electrode also serves an area for joining of an interconnector.

11. A solar cell having a by-pass diode, comprising:
    a semiconductor substrate of a first conductivity type having a front surface and a back surface;
    a second conductivity type layer formed in a first portion of the front surface of said substrate for receiving light for photoelectric conversion;
    a second conductivity type well formed in a second portion of the front surface of said substrate;
    a first conductivity type layer formed in said well;
    a comb-shaped front electrode formed over the front surface of said semiconductor substrate, said comb-shaped electrode including a plurality of narrow grid fingers extending from a bus portion,
    short-circuit prevention layers of the second conductivity type having a high impurity concentration formed at least under said grid fingers along the periphery of said second conductivity type layer for preventing short-circuiting between said grid fingers of said comb-shaped electrode and said first conductivity type substrate;

a back electrode formed on the back surface of said semiconductor substrate; and a plurality of short-circuit electrodes for short-circuiting a parasitic diode including said first conductivity type substrate and said second conductivity type well, wherein said first conductivity type substrate and said second conductivity type layer constitute said solar cell, said second conductivity type well and said first conductivity type layer constitute said by-pass diode, said by-pass diode is formed under the bus portion of said comb-shaped electrode, said solar cell and said by-pass diode are electrically connected in parallel between said front electrode and said back electrode with their polarities being opposite to each other.

12. A solar cell having a by-pass diode, comprising:
a semiconductor substrate of a first conductivity type having a front surface and a back surface;
a second conductivity type layer formed in a first portion of the front surface of said substrate for receiving light for photoelectric conversion;
a second conductivity type well formed in a second portion of the front surface of said substrate;
a first conductivity type layer formed in said well;
a comb-shaped front electrode formed over the front surface of said semiconductor substrate, said comb-shaped electrode including a plurality of narrow grid fingers and a bus portion to which the grid fingers are connected, and said bus portion including at least one enlarged portion in a region intermediate both ends of said bus portion;
a back electrode formed on the back surface of said semiconductor substrate; and
a plurality of short-circuit electrodes, provided along outer edges of said second conductivity type well and between at least some of said grid fingers of said comb-shaped electrode for short-circuiting a parasitic diode including said first conductivity type substrate and said second conductivity type well,
wherein said first conductivity type substrate and said second conductivity type layer constitute said solar cell, said second conductivity type well and said first conductivity type layer constitute said by-pass diode,
said by-pass diode is formed under the bus portion of said comb-shaped electrode, and
said solar cell and said by-pass diode are electrically connected in parallel between said front electrode and said back electrode with their polarities being opposite to each other.

13. The solar cell according to claim 12, wherein a first conductivity type channel stopper having a high impurity concentration is formed along the periphery of said second conductivity type well.

14. The solar cell according to claim 12, wherein a BSF layer of the first conductivity type having a high impurity concentration is formed between said back electrode and said first conductivity type substrate.

15. The solar cell according to claim 12, wherein said enlarged bus portion of said comb-shaped electrode is opague.

16. The solar cell according to claim 12, wherein the enlarged portion of said comb-shaped electrode also serves as an area for joining of an interconnector.

17. A solar cell having a by-pass diode, comprising:
a semiconductor substrate of a first conductivity type having a front surface and a back surface;
a second conductivity type layer formed in a first portion of the front surface of said substrate for receiving light for photoelectric conversion;
a second conductivity type well formed in a second portion of the front surface of said substrate;
a first conductivity type layer formed in said well;
a comb-shaped front electrode formed over the front surface of said semiconductor substrate, said comb-shaped electrode including a plurality of narrow grid fingers and a bus portion to which the grid fingers are connected, and said bus portion including at least one enlarged portion in a region intermediate both ends of said bus portion;
a short-circuit prevention layer of the second conductivity type having a high impurity concentration formed at least under said grid fingers along the periphery of said second conductivity type layer in order to prevent short-circuiting between said grid fingers of said comb-shaped electrode and said first conductivity type substrate;
a back electrode formed on the back surface of said semiconductor substrate; and
a plurality of short-circuit electrodes for short-circuiting a parasitic diode including said first conductivity type substrate and said second conductivity type well,
wherein said first conductivity type substrate and said second conductivity type layer constitute said solar cell, said second conductivity type well and said first conductivity type layer constitute said by-pass diode,
said by-pass diode is formed under the bus portion of said comb-shaped electrode, and
said solar cell and said by-pass diode are electrically connected in parallel between said front electrode and said back electrode with their polarities being opposite to each other.

18. A solar cell having a by-pass diode, comprising:
a semiconductor substrate of the first conductivity type having a front surface and a back surface;
a first layer having a second conductivity type formed in a first portion of the front surface of said substrate for receiving light for photoelectric conversion;
a well having a second conductivity type diffused in a second portion of the front surface of said substrate;
a second layer having a first conductivity type formed in said well;
a comb-shaped front electrode formed over part of the front surface of said semiconductor substrate, said comb-shaped electrode including a plurality of narrow grid fingers extending from a bus portion, said bus portion including an enlarged portion in a region intermediate both ends of said bus portion and wider than said bus portion;
short circuit prevention layers having a high impurity concentration of the second conductivity type formed under said grid fingers along the periphery of said first layer in order to prevent short circuiting between said grid fingers of said comb-shaped electrode and said substrate; and a back electrode formed on the back surface of said substrate, wherein said substrate and said first layer constitute said solar cell, and said well and said second layer constitute said by-pass diode;

said by-pass diode is formed under said enlarged portion of said comb-shaped electrode, and said solar cell and said by-pass diode are electrically connected in parallel between said front electrode and said back electrode with their polarities being opposite to each other.

* * * * *